United States Patent
Anderson et al.

(10) Patent No.: US 7,309,020 B2
(45) Date of Patent: *Dec. 18, 2007

(54) DEPOSITION FABRICATION USING INKJET TECHNOLOGY

(75) Inventors: Frank E. Anderson, Sadieville, KY (US); Yimin Guan, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/397,107

(22) Filed: Apr. 4, 2006

(65) Prior Publication Data

US 2006/0175421 A1    Aug. 10, 2006

Related U.S. Application Data

(63) Continuation of application No. 10/973,106, filed on Oct. 25, 2004, now Pat. No. 7,055,756.

(51) Int. Cl.
| | |
|---|---|
| *G06K 19/06* | (2006.01) |
| *H01B 1/00* | (2006.01) |
| *H01B 1/12* | (2006.01) |
| *B41M 5/00* | (2006.01) |
| *B44C 1/17* | (2006.01) |
| *G03G 7/00* | (2006.01) |
| *G01N 33/00* | (2006.01) |

(52) U.S. Cl. .................. 235/492; 428/195.1; 252/500; 436/138

(58) Field of Classification Search ................ 235/492, 235/488, 380; 257/528, 737, 772, 782, 415; 427/123, 126.2, 180, 255.33, 258, 299; 428/304.4, 428/195.1, 137; 252/500, 301.4 R; 436/178; 438/14

See application file for complete search history.

(56) References Cited

U.S. PATENT DOCUMENTS 3,486,688 A * 12/1969 Irvine .......................... 216/20

(Continued)

FOREIGN PATENT DOCUMENTS

EP     1335393 A1 * 8/2003

OTHER PUBLICATIONS

PICTORICO Ink Jet Media: Ceramic Particle Coating, <<http://www.pictorico.com/ceramic.php>>, Pictorico USA, Inc., Oct. 25, 2004.

(Continued)

*Primary Examiner*—Michael G. Lee
*Assistant Examiner*—Thien T Mai
(74) *Attorney, Agent, or Firm*—Taft Stettinius & Hollister

(57) ABSTRACT

A method of fabricating a circuit lead, the method comprising: (a) depositing a slurry upon a substrate in a predetermined pattern, the substrate including a plurality of substantially uniformly patterned micropores operative to drain a fluid component of the slurry from the surface of the substrate, while maintaining conductive particles of the slurry on a surface of the substrate; and (b) drying the conductive particles to secure the conductive particles upon a surface of the substrate and provide a circuit lead. The invention also includes an electronic circuit comprising: (a) a substrate including a plurality of micropores that are substantially uniformly patterned; (b) a microchip; and (c) a circuit lead in electrical communication with the microchip and contacting the substrate, the circuit lead comprising conductive particles deposited upon the substrate by ejecting a slurry from an inkjet printer.

28 Claims, 2 Drawing Sheets

U.S. PATENT DOCUMENTS

| | | | |
|---|---|---|---|
| 3,843,436 A | 10/1974 | Yangida et al. | |
| 4,387,131 A * | 6/1983 | Anderson et al. | 428/201 |
| 5,240,862 A * | 8/1993 | Koenhen et al. | 436/178 |
| 5,257,042 A * | 10/1993 | Buhler | 347/64 |
| 5,493,096 A * | 2/1996 | Koh | 219/121.71 |
| 5,925,934 A * | 7/1999 | Lim | 257/778 |
| 6,180,029 B1 * | 1/2001 | Hampden-Smith et al. | 252/301.4 R |
| 6,206,292 B1 | 3/2001 | Robertz et al. | |
| 6,229,442 B1 | 5/2001 | Rolin et al. | |
| 6,366,260 B1 | 4/2002 | Carrender | |
| 6,549,132 B2 | 4/2003 | Parrotta et al. | |
| 6,689,421 B2 | 2/2004 | Patel et al. | |
| 6,692,456 B1 * | 2/2004 | Eppstein et al. | 604/22 |
| 6,697,694 B2 | 2/2004 | Mogensen | |
| 7,055,756 B2 * | 6/2006 | Anderson et al. | 235/492 |
| 2003/0022403 A1 * | 1/2003 | Shimoda et al. | 438/14 |
| 2003/0044714 A1 * | 3/2003 | Teraoka et al. | 430/138 |
| 2003/0136503 A1 | 7/2003 | Green et al. | |
| 2003/0213614 A1 | 11/2003 | Furusawa et al. | |
| 2004/0061232 A1 * | 4/2004 | Shah et al. | 257/758 |
| 2004/0125040 A1 | 7/2004 | Ferguson et al. | |
| 2004/0191497 A1 * | 9/2004 | Hiraoka et al. | 428/304.4 |
| 2004/0224135 A1 * | 11/2004 | Krebs | 428/195.1 |
| 2004/0232386 A1 * | 11/2004 | Yorita et al. | 252/500 |
| 2005/0170153 A1 * | 8/2005 | Miller et al. | 428/195.1 |
| 2006/0280906 A1 * | 12/2006 | Trentacosta et al. | 428/137 |

OTHER PUBLICATIONS

PICTORICO Ink Jet Media: Dot & Digital Pattern, <<http://www.pictorico.com/hot_digital.php>>, Pictorico USA, Inc., Oct. 25, 2004.

* cited by examiner

DEPOSITION FABRICATION USING INKJET TECHNOLOGY

CROSS REFERENCE TO RELATED APPLICATIONS

The present application is claims priority to, and is a continuation of, U.S. patent application Ser. No. 10/973,106, filed Oct. 25, 2004, now U.S. Pat. No. 7,055,756, the disclosure of which is hereby incorporated by reference.

RELATED ART

1. Field of the Invention

The present invention is directed to inkjet printing, and more specifically to inkjet printing utilizing conductive ink deposition to fabricate conductive patterns upon a filtered substrate.

2. Related Art

Radio Frequency Identification (RFID) tags have been developed and envisioned to replace the bar code as the preeminent future identification tool. Present day methods of manufacturing RFID antennae include costly plating and etching processes similar to current semiconductor device manufacturing techniques.

RFID is an automatic identification technology whereby digital data encoded in an RFID tag or "smart label" is captured by a reader using radio waves and, therefore, RFID does not require the tag or label to be visually apparent in order to read its stored data. An RFID system consists of a tag, which is made up of a microchip with an antenna, and a reader with an antenna. The reader sends out electromagnetic waves and the tag antenna is tuned to receive these waves and transmit stored data on the microchip to the reader. RFID tags are either "passive" (no battery) or "active" (self-powered by a battery), with a passive RFID tag drawing power from an electromagnetic field created by the reader to power the microchip's circuits. The microchip then modulates the waves and sends the waves back to the reader where the reader converts the new waves into digital data. RFID tags can be read-only (stored data can be read but not changed), read/write (stored data can be altered or re-written), or a combination, in which some data is permanently stored while other memory is left accessible for later encoding and updates.

Therefore, there remains a need in the art for more widespread use of RFID tags, as well as techniques, and devices produced from such techniques, that reduce the costs associated with RFID tag fabrication. In addition, there is a need in the art for increased quality control and consistency between devices and device subsets produced for RFID applications.

SUMMARY OF THE INVENTION

The present invention is directed to inkjet printing, and more specifically to inkjet printing utilizing conductive ink deposition to fabricate conductive patterns upon a filtered substrate. The present invention includes methods, and devices manufactured using such methods, for fabricating RFID tags, and more specifically, RFID antennae. The present invention makes use of conductive inks comprising a carrier fluid and suspended conductive particles that are ejected onto a printable medium to create conductive patterns. The present invention incorporates substrates having channels adapted to draw away the carrier fluid from the surface of the substrate to leave behind the conductive particles on the surface. In this manner, a droplet of conductive ink spreads over a smaller area than using conventional substrates and allows for greater precision and density in depositing the conductive particles. Exemplary substrates for use with the present invention may be subjected to a vacuum or elevated temperature environment to dry the conductive particles and stabilize the positioning of the particles on the substrate surface.

It is a first aspect of the present invention to provide a method of fabricating a circuit lead, the method comprising: (a) depositing a slurry upon a substrate in a predetermined pattern, the substrate including a plurality of substantially uniformly patterned micropores operative to drain a fluid component of the slurry from the surface of the substrate, while maintaining conductive particles of the slurry on a surface of the substrate; and (b) drying the conductive particles to secure the conductive particles upon a surface of the substrate and provide a circuit lead.

In a more detailed embodiment of the first aspect, the plurality of micropores are generally vertically oriented. In a further detailed embodiment, the slurry deposition is carried out using an inkjet printer. In still a further detailed embodiment, the slurry deposition includes repositioning at least one of the substrate and a nozzle of the inkjet printer to deposit the conductive particles upon the substrate in the predetermined pattern. In a more detailed embodiment, the act of drying the substrate includes subjecting the substrate to an elevated temperature ambient. In a more detailed embodiment, the act of drying the substrate includes applying a vacuum to the substrate.

It is a second aspect of the present invention to provide a method of fabricating a circuit lead, the method comprising: (a) depositing a slurry upon a filtration medium in a predetermined arrangement, the filtration medium including a plurality of micropores in a substantially uniform arrangement operative to filter solid conductive components of the slurry from a fluid component of the slurry; (b) drying the solid conductive components to secure a substantial portion of the solid conductive components upon a surface of the filtration medium and provide a circuit lead; and (c) mounting a microchip in electrical communication with the circuit lead.

In a more detailed embodiment of the second aspect, the plurality of micropores are generally vertically oriented. In a further detailed embodiment, the slurry deposition is carried out using an inkjet printer. In still a further detailed embodiment, the slurry deposition includes repositioning at least one of the filtration medium and a nozzle of the inkjet printer to deposit the solid conductive components upon the filtration medium in the predetermined arrangement. In a more detailed embodiment, the act of drying the filtration medium includes subjecting the filtration medium to an elevated temperature ambient. In a more detailed embodiment, the act of drying the filtration medium includes applying a vacuum to the filtration medium.

It is a third aspect of the present invention to provide an electronic circuit comprising: (a) a substrate including a plurality of micropores that are substantially uniformly patterned; (b) a microchip; and (c) a circuit lead in electrical communication with the microchip and contacting the substrate, the circuit lead comprising conductive particles deposited upon the substrate by ejecting a slurry from an inkjet printer.

In a more detailed embodiment of the third aspect, at least one of a median width of the micropores and a median length of the micropores is less than at least one of a median width of the conductive particles and a median length of the conductive particles. In yet another more detailed embodiment, a summation of a volume of each micropore of the substrate is greater than the volume of a carrier fluid of the slurry. In a further detailed embodiment, the micropores extend substantially through an entire thickness of the substrate. In still a further detailed embodiment, the substrate comprises a coating applied to a base substrate, where the base substrate includes at least one of paper, a polymer, a composite, and a semiconductor.

It is a fourth aspect of the present invention to provide an electronic circuit comprising: (a) a substrate including a plurality of micropores in a substantially uniform arrangement; and (b) an circuit lead formed on the substrate for in electrical communication with a microchip, the circuit lead comprising conductive particles deposited upon the substrate by ejecting a slurry from an inkjet printer.

In a more detailed embodiment of the fourth aspect, at least one of a median width of the micropores and a median depth of the micropores is less than at least one of a median width of the conductive particles and a median length of the conductive particles. In yet another more detailed embodiment, a summation of an available volume of the micropores of the substrate is greater than a volume of a carrier fluid, comprising the slurry, deposited on the substrate. In a further detailed embodiment, the micropores extend substantially through an entire thickness of the substrate. In still a further detailed embodiment, the substrate comprises a coating applied to a base substrate, where the base substrate includes at least one of paper, a polymer, a composite, and a semiconductor.

It is a fifth aspect of the present invention to provide a method of accurately and precisely depositing conductive particles of a conductive ink from an inkjet printer, the method comprising: (a) orienting a substrate with respect to an inkjet printer, the substrate including a plurality of generally aligned interstices adapted to filter a conductive ink; (b) depositing the conductive ink upon the substrate in a predetermined pattern using the inkjet printer, where the conductive ink comprises conductive particles and a carrier fluid; and (c) drying the conductive particles to mount the conductive particles upon a surface of the substrate and provide a conductive lead.

In a more detailed embodiment of the fifth aspect, the act of drying the substrate includes subjecting the substrate to an elevated temperature ambient. In yet another more detailed embodiment, the act of drying the substrate includes applying a vacuum to the substrate. In a further detailed embodiment, the conductive ink deposited on the substrate is chemically compatible with the substrate. In still a further detailed embodiment, the conductive ink comprises a slurry of solid conductive particles and the carrier fluid. In a more detailed embodiment, the act of depositing the conductive ink includes depositing the conductive ink using more than one nozzle of a printhead associated with the inkjet printer.

DETAILED DESCRIPTION

Figure 1:
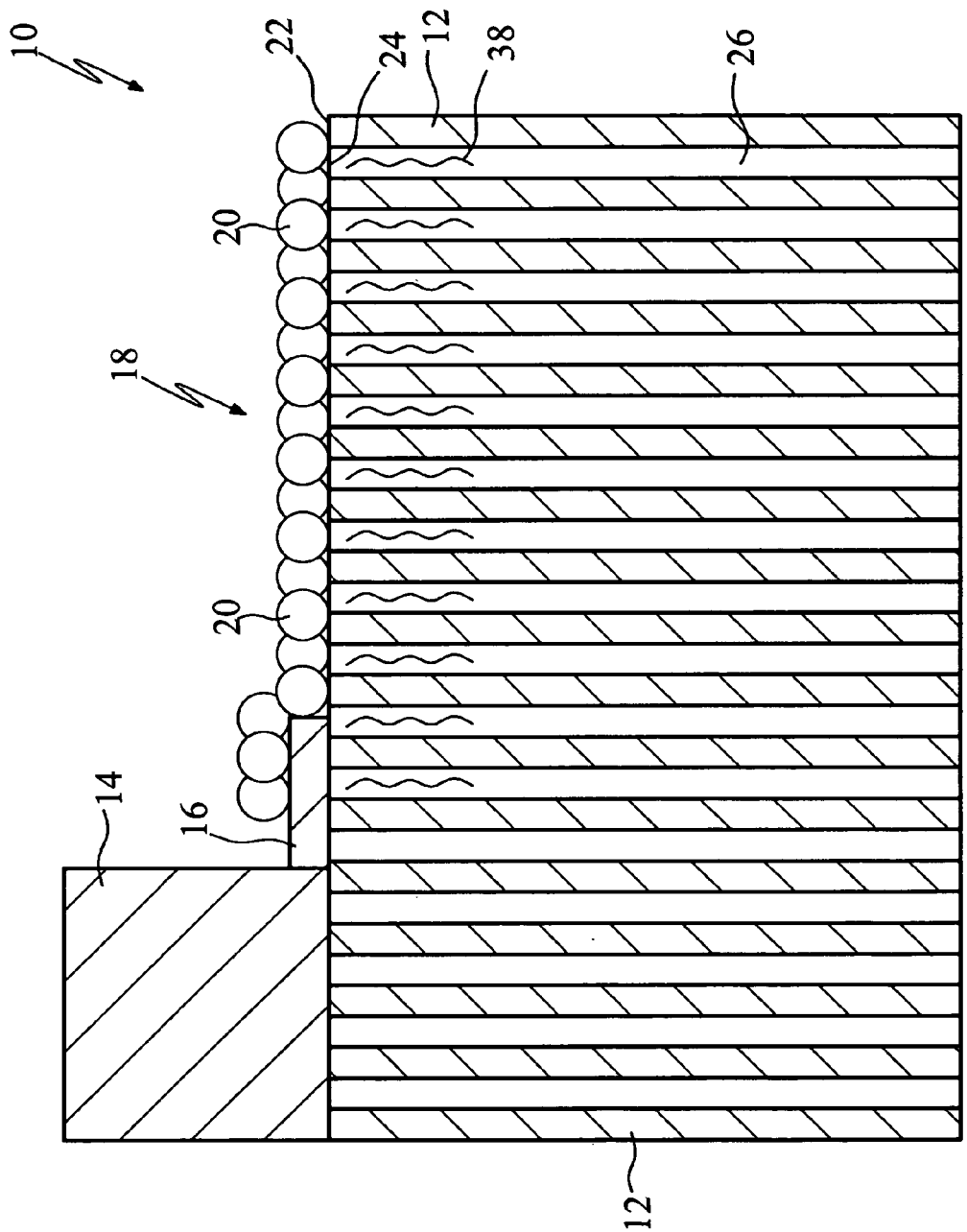
FIG. 1 is a cross-sectional view of a first exemplary embodiment in accordance with the present invention.

The exemplary embodiments of the present invention are described and illustrated below to encompass methods, and devices produced in accordance with such methods, for depositing conductive materials upon a filtered substrate. Of course, it will be apparent to those of ordinary skill in the art that the preferred embodiments discussed below are exemplary in nature and may be reconfigured without departing from the scope and spirit of the present invention. In addition, those of ordinary skill will readily comprehend various devices that may be fabricated in accordance with the methods discussed herein and, therefore, the disclosure is not limited to the exemplary embodiments discussed herein, as these embodiments are for purposes of illustrating the invention only. However, for clarity and precision, the exemplary embodiments as discussed below may include optional steps or features that one of ordinary skill will recognize as not being a requisite to fall within the scope of the present invention. As used herein, micropore refers to any orderly channel within a substrate adapted to enable a fluid to flow therein and having an opening inhibiting throughput of particles having a mean diameter of 20-100 nanometers.

In fabricating a Radio Frequency Identification (RFID) antenna utilizing an inkjet printer, a number of considerations may be involved in achieving the desired conductivity, uniformity, and repeatability that include, without limitation, the type conductive ink deposited, any post-deposition treatment of the antenna, the software and printing mode utilized to deposit the ink, the printer and type of printhead used in depositing the ink, and the media upon which the ink is deposited. While the present invention, as discussed herein, may appear to be directed to the latter consideration, it is to be understood that the latter consideration is simple one piece of the present invention.

During a conductive ink printing process, at least two mechanisms are involved in forming the conductive pattern: (1) deposition and subsequent connection of the individual conductive particles to form a conductive path; and (2) absorption of a liquid carrier phase that may include constituents such as, without limitation, water, a surfactant, and a humectant. To achieve the first mechanism most efficiently, a relatively smooth and solid substrate surface is favorable to reduce gaps between conductive particles from elevational changes and discontinuities in the surface. To achieve the second mechanism, however, a surface having a non-uniform topography is advantageous to provide hollows or cavities for the separation of the carrier fluid from the conductive particles, which hasten drying of the conductive particles stabilizing the relative position of the conductive particles on the substrate surface. Therefore, at first glance, it might appear that these interests are competing and cannot be concurrently accommodated. Nevertheless, the present invention is operative to accommodate each of these interests without placing both in direct competition with one another.

Referencing FIG. 1, a first exemplary embodiment comprises an RFID tag 10 that includes a substrate 12 having a microchip 14 positioned thereon. Those of ordinary skill are familiar with the plethora of techniques for mounting a microchip 14 to a substrate 12 and, therefore, an exhaustive explanation has been omitted for purposes of brevity. The microchip 14 includes at least one contact pad 16 in electrical communication with an inkjet deposited antenna 18 that comprises a plurality of conductive particles 20 deposited in a predetermined pattern.

An exemplary substrate 12 in accordance with the present invention includes a generally smooth surface 22 with a plurality of openings 24 within the surface of the substrate 12 leading to micropores 26 within the substrate. The substrate 12 is comprised of materials that are not especially chemically reactive with the deposited components in contact therewith and those of ordinary skill will understand the utility of the substrate 12 being reactively dormant during deposition of the conductive ink and later processing. The substrate 12 may be comprised of aligned particles that are spaced apart to create micropores 26 therebetween. Exemplary materials for use as the substrate 12 include, without limitation, ceramic particles. In this exemplary substrate 12, the micropores 26 are vertical and linearly oriented, however, it is to be understood that angled micropores and non-linear micropores may be operative with the present invention and these operative orientations likewise fall within the scope of the present invention. It is to be understood that the uniformity of the substrate particles is of increasing importance to fabricate micropores 26 that are repeatable and generally aligned. In particular, the dimensions of the micropores 26 are such that the mean particle size of the conductive particles 20 deposited thereover will not completely plug the micropores. Commercially available substrates that may be used with the present invention include media from Pictorico (www.pictorico.com).

Figure 2:
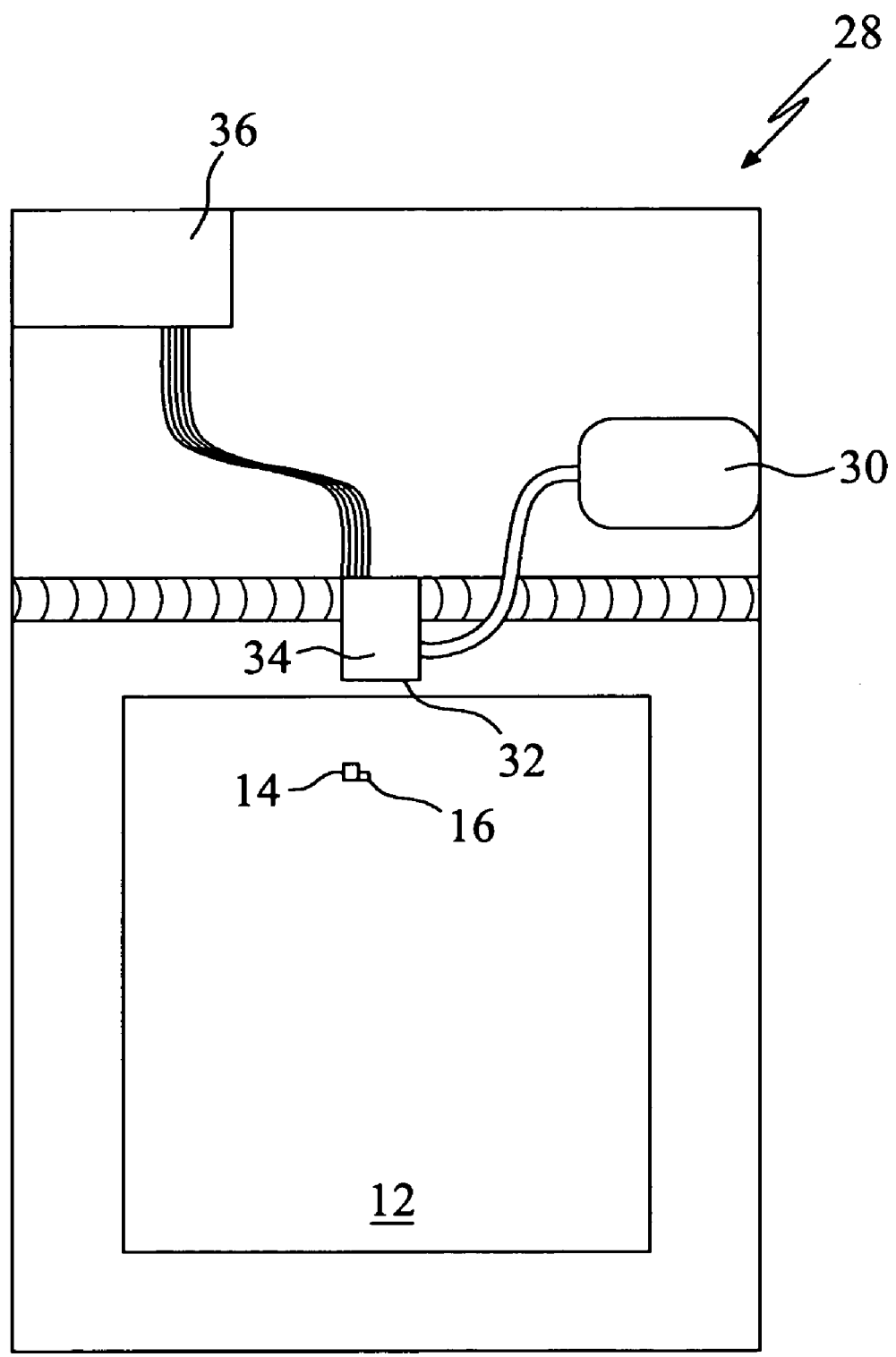
FIG. 2 is an overhead view of an exemplary printer configuration that may be used to fabricate the antenna of the first exemplary embodiment as shown in FIG. 1.

Referring to FIGS. 1 and 2, an inkjet printer 28 may be utilized to deposit the conductive particles 20 of the RFID antenna 18. The inkjet printer 28 includes an ink reservoir 30 in fluid communication with a plurality of nozzles 32 of a printhead 34 and controls 36 operative to position the nozzles 32 over particular locations of the substrate 12. A bitmap may be communicated to the printer 28 and translated by the controls 36 to create a printing sequence where the nozzles 32 of the printhead 34 will be fired to eject ink onto the substrate 12. In this exemplary embodiment, the ink comprises a slurry that includes conductive particles 20 and a carrier fluid 38 (See FIG. 1) that may include a surfactant and a humectant. Those of ordinary skill are familiar with the various commercially available conductive inks that may be used in accordance with the present invention. Such inks include, without limitation, silver collide inks and are available from Nippon Paint Company (www.nipponpaint.co.jp).

The printing sequence is operative to acknowledge the position of the microchip 14 and contact pad 16 on the substrate 12. More specifically, the printing sequence will call for the deposition of the ink, including the conductive particles 20, onto the substrate 12 to form the antenna 18 in electrical communication with the contact pad 16. Those of ordinary skill are familiar with the plethora of antenna designs and orientations available for use with RFID tags 10 that may be carried out using an inkjet printer 28 in accordance with the present invention, each of which concurrently fall within the scope of the present invention.

Referencing FIGS. 1 and 2, ink is ejected from the nozzles 32 and deposited onto the substrate 12 and the openings 24 therein allow the carrier fluid 38 to be drawn into the micropores 26 and away from the surface 22. This separation of carrier fluid 38 and conductive particles 20 results in less carrier fluid 38 in contact with the conductive particles 20 above the surface 22, providing fewer avenues of movement for the particles 20 in contact with carrier fluid 38 above the substrate surface 22. The concentration of conductive particles 20 resulting from less carrier fluid 38 on the surface 22 of the substrate 12 allows for more precise and accurate placement of the conductive particles 20, which may result in better connections between the deposited conductive particles 20. This can be sharply contrasted with prior art systems where the droplet spread out over the substrate before being considerably absorbed, creating a greater footprint. After the ink is deposited, the conductive particles 20 on the surface 22 of the substrate 12 are dried to stabilize the orientation of the particles on the surface.

Drying of the conductive particles 20 on the substrate surface 22 may be carried out using numerous techniques. A first exemplary technique includes subjecting the substrate 12 and deposited particles 20 to ambient conditions and allowing the fluid components 38 of the ink to vaporize and effectively dry the conductive particles 20. A second exemplary technique includes subjecting the substrate 12 and deposited particles 20 to a vacuum to draw off the fluid components 38 of the ink and effectively dry the conductive particles 20. A third exemplary technique includes subjecting the substrate 12 and deposited particles 20 to an elevated temperature environment to vaporize the fluid 38 and effectively dry the conductive particles 20. A fourth exemplary technique includes subjecting the substrate 12 and deposited particles 20 to a vacuum in a heated environment to vaporize the fluid 38 and effectively dry the conductive particles 20. Those of ordinary skill are familiar with other techniques for drying a deposited material on a substrate, and such techniques concurrently fall within the scope of the present invention.

It is also within the scope and spirit of the present invention to fabricate antennae 18 on the substrate 12 without a microchip 14 and/or a contact pad 16 being mounted to the substrate. In this manner, the antenna 18 is prefabricated and may be later mounted to the contact pad 16 of the microchip 14 to comprise the RFID tag 10.

It is also within the scope of the present invention to mount the substrate 12 to another base substrate (not shown) comprising a polymer, a paper base, a semiconductor, or a composite, where the substrate 12 may be applied to the base substrate prior to or subsequent to deposition of the conductive particles 20.

It is also within the scope of the present invention that the median width of the micropores 26 and a median depth of the micropores 26 are less than at least one of a median width of the conductive particles 20 and a median length of the conductive particles 20. It should also be understood that the thickness of the substrate 12 may be such that the micropores 26 extend from a top surface through to a bottom surface, thereby extending the entire thickness of the substrate 12. It is to be understood that the micropores 26 need not extend substantially the entire thickness of the substrate 12 in order to fall within the scope of the present invention. Still further, the volume available within the micropores 26 of the substrate 12 is preferably greater than the volume of the carrier fluid 38 deposited on the substrate 12, however, substrates having micropore 26 volumes less than the eventual volume of carrier fluid 38 deposited thereon do not necessarily fall outside of the scope of the present invention.

Following from the above description and invention summaries, it should be apparent to those of ordinary skill in the art that, while the methods and apparatuses herein described constitute exemplary embodiments of the present invention, the invention contained herein is not limited to this precise embodiment and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the invention disclosed herein in order to fall within the scope of any claims, since the invention is defined by the claims and since inherent and/or unforeseen advantages of the present invention may exist even though they may not have been explicitly discussed herein.

What is claimed is:

1. A method of fabricating a circuit lead, the method comprising:
   depositing a slurry upon a substrate in a predetermined pattern, the substrate including a plurality of substantially uniformly patterned micropores operative to drain a fluid component of the slurry from the surface of the substrate, while maintaining conductive particles of the slurry on a surface of the substrate; and
   drying the conductive particles to secure the conductive particles upon a surface of the substrate and provide a circuit lead.

2. The method of claim 1, wherein the plurality of micropores are generally vertically oriented.

3. The method of claim 1, wherein the slurry deposition is carried out using an inkjet printer.

4. The method of claim 3, wherein the slurry deposition includes repositioning at least one of the substrate and a nozzle of the inkjet printer to deposit the conductive particles upon the substrate in the predetermined pattern.

5. The method of claim 1, wherein the act of drying the substrate includes subjecting the substrate to an elevated temperature ambient.

6. The method of claim 1, wherein the act of drying the substrate includes applying a vacuum to the substrate.

7. A method of fabricating a circuit lead, the method comprising:
   depositing a slurry upon a filtration medium in a predetermined arrangement, the filtration medium including a plurality of micropores in a substantially uniform arrangement operative to filter solid conductive components of the slurry from a fluid component of the slurry;
   drying the solid conductive components to secure a substantial portion of the solid conductive components upon a surface of the filtration medium and provide a circuit lead; and
   mounting a microchip in electrical communication with the circuit lead.

8. The method of claim 7, wherein the plurality of micropores are generally vertically oriented.

9. The method of claim 7, wherein the slurry deposition is carried out using an inkjet printer.

10. The method of claim 9, wherein the slurry deposition includes repositioning at least one of the filtration medium and a nozzle of the inkjet printer to deposit the solid conductive components upon the filtration medium in the predetermined arrangement.

11. The method of claim 7, wherein the act of drying the filtration medium includes subjecting the filtration medium to an elevated temperature ambient.

12. The method of claim 7, wherein the act of drying the filtration medium includes applying a vacuum to the filtration medium.

13. An electronic circuit comprising:
   a substrate including a plurality of micropores that are substantially uniformly patterned;
   a microchip; and
   a circuit lead in electrical communication with the microchip and contacting the substrate, the circuit lead comprising conductive particles deposited upon the substrate by ejecting a slurry from an inkjet printer.

14. The electronic circuit of claim 13 wherein at least one of a median width of the micropores and a median length of the micropores is less than at least one of a median width of the conductive particles and a median length of the conductive particles.

15. The electronic circuit of claim 13, wherein a summation of a volume of each micropore of the substrate is greater than the volume of a carrier fluid of the slurry.

16. The electronic circuit of claim 13, wherein the micropores extend substantially through an entire thickness of the substrate.

17. The electronic circuit of claim 13, wherein the substrate comprises a coating applied to a base substrate, wherein the base substrate includes at least one of paper, a polymer, a composite, and a semiconductor.

18. An electronic circuit comprising:
   a substrate including a plurality of micropores in a substantially uniform arrangement; and
   a circuit lead formed on the substrate for electrical communication with a microchip, the circuit lead comprising conductive particles deposited upon the substrate by ejecting a slurry from an inkjet printer.

19. The electronic circuit of claim 18 wherein at least one of a median width of the micropores and a median depth of the micropores is less than at least one of a median width of the conductive particles and a median length of the conductive particles.

20. The electronic circuit of claim 18, wherein a summation of an available volume of the micropores of the substrate is greater than a volume of a carrier fluid, comprising the slurry, deposited on the substrate.

21. The electronic circuit of claim 18, wherein the micropores extend substantially through an entire thickness of the substrate.

22. The electronic circuit of claim 18, wherein the substrate comprises a coating applied to a base substrate, wherein the base substrate includes at least one of paper, a polymer, a composite, and a semiconductor.

23. A method of accurately and precisely depositing conductive particles of a conductive ink from an inkjet printer, the method comprising:
   orienting a substrate with respect to an inkjet printer, the substrate including a plurality of generally aligned interstices adapted to filter a conductive ink;
   depositing the conductive ink upon the substrate in a predetermine pattern using the inkjet printer, where the conductive ink comprises conductive particles and a carrier fluid; and
   drying the conductive particles to mount the conductive particles upon a surface of the substrate and provide a conductive lead.

24. The method of claim 23, wherein the act of drying the substrate includes subjecting the substrate to an elevated temperature ambient.

25. The method of claim 23, wherein the act of drying the substrate includes applying a vacuum to the substrate.

26. The method of claim 23, wherein the conductive ink deposited on the substrate is chemically compatible with the substrate.

27. The method of claim 23, wherein the conductive ink comprises a slurry of solid conductive particles and the carrier fluid.

28. The method of claim 23, wherein the act of depositing the conductive ink includes depositing the conductive ink using more than one nozzle of a printhead associated with the inkjet printer.

* * * * *